United States Patent
Kumasaka et al.

(10) Patent No.: US 6,515,405 B1
(45) Date of Patent: Feb. 4, 2003

(54) MOUNTING STRUCTURE OF PIEZOELECTRIC TRANSFORMER AND METHOD OF MOUNTING PIEZOELECTRIC TRANSFORMER

(75) Inventors: Katsunori Kumasaka, SomA; Koichi Saito, Sendai, both of (JP)

(73) Assignee: Tokin Corporation, Sendai (JP)

( * ) Notice: Subject to any disclaimer, the term of this patent is extended or adjusted under 35 U.S.C. 154(b) by 0 days.

(21) Appl. No.: 09/463,803

(22) PCT Filed: Jun. 7, 1999

(86) PCT No.: PCT/JP99/03029

§ 371 (c)(1),
(2), (4) Date: Jan. 29, 2000

(87) PCT Pub. No.: WO99/65089

PCT Pub. Date: Dec. 16, 1999

(30) Foreign Application Priority Data

Jun. 5, 1998 (JP) .......................... 10-157936

(51) Int. Cl.⁷ .............................. H01L 41/08
(52) U.S. Cl. ...................... 310/345; 310/348
(58) Field of Search ................. 310/344, 345, 310/348, 366, 359

(56) References Cited

U.S. PATENT DOCUMENTS

| | | | | |
|---|---|---|---|---|
| 2,830,204 A | * | 4/1958 | Harris | 310/345 X |
| 3,622,813 A | * | 11/1971 | Kumon | 310/345 |
| 3,662,194 A | * | 5/1972 | Moriki et al. | 310/345 X |
| 3,694,674 A | * | 9/1972 | Inoue | 310/345 X |
| 5,998,909 A | * | 12/1999 | Kumasaka et al. | 310/348 |
| 6,037,705 A | * | 3/2000 | Kawabata et al. | 310/345 |
| 6,057,633 A | * | 5/2000 | Inoi et al. | 310/345 |

FOREIGN PATENT DOCUMENTS

| | | | |
|---|---|---|---|
| EP | 99955564 | 11/1999 | |
| JP | 44-23196 | * 2/1969 | ................. 310/345 |
| JP | 6342945 | * 12/1994 | ................. 310/345 |
| JP | 8-306981 | 11/1996 | |
| JP | 8-316543 | 11/1996 | |
| JP | 9-83105 | 2/1997 | |
| JP | 9-83033 | 3/1997 | |
| JP | 9-129941 | 5/1997 | |
| JP | 9-246619 | 9/1997 | |
| JP | 9-260740 | 10/1997 | |

* cited by examiner

*Primary Examiner*—Mark O. Budd
(74) *Attorney, Agent, or Firm*—Morgan, Lewis & Bockius LLP

(57) ABSTRACT

In a structure in which a piezoelectric transformer element (11) is mounted on a circuit board (27) equipped with a circuit component for driving the piezoelectric transformer element (11), at least one of a fixing member (33, 35) and a supporting member (37, 39, 41) made of an elastic material having flexibility is interposed between the piezoelectric transformer element (11) and the circuit board (27) so as to cover vibration node portions (29, 31) of the piezoelectric transformer element (11) and at least a part of the remaining portion except the vibration node portions (29, 31). Thus, the piezoelectric transformer element (11) is fixed to the circuit board (27).

1 Claim, 5 Drawing Sheets

(a)

(b)

(a)

(b)

(a)

(b)

(a)

(b)

(a)

(b)

MOUNTING STRUCTURE OF PIEZOELECTRIC TRANSFORMER AND METHOD OF MOUNTING PIEZOELECTRIC TRANSFORMER

TECHNICAL FIELD

This invention relates to a structure in which a piezoelectric transformer element for use in a piezoelectric inverter of a backlight for a liquid crystal display or the like is mounted on a circuit board equipped with circuit components and a method of mounting the same.

BACKGROUND ART

As a conventional mounting method of a piezoelectric transformer element, there is known a mounting method in which the piezoelectric transformer element is contained in a case and an external terminal of the case is connected by soldering or the like to a circuit board equipped with a circuit component. Another mounting method is also known in which no casing is carried out to avoid a problem of heat generation following an increase in output power but a vibration node is fixed by the use of a flexible elastic material, for example, silicone.

In order to adjust the brightness of a backlight, it is required to carry out control of an inverter electrically connected to the backlight. As a circuit system for such brightness adjustment, a burst adjustment is generally used.

This results in a problem of generation of an audible sound, which has not been caused in the conventional method of fixedly supporting the piezoelectric transformer used in the inverter. The reason is as follows. The piezoelectric transformer is generally driven in a single mode. However, by addition of a brightness adjusting function, the piezoelectric transformer itself is driven in a mode other than the single mode. Even if the piezoelectric transformer is fixedly supported at a nodal point in the single mode, a nodal point in the other mode will be deviated from the supporting point. This results in generation of the audible sound in a mounted state.

Therefore, it is a first object of this invention to provide a mounting structure of a piezoelectric transformer element, which can minimize generation of an audible sound even if it is used in vibration modes of different frequencies.

It is a second object of this invention to provide a method of mounting the above-mentioned piezoelectric transformer element.

DISCLOSURE OF THE INVENTION

According to this invention, there is provided a mounting structure of a piezoelectric transformer element which is mounted on a circuit board equipped with at least one circuit component for driving the piezoelectric transformer element, wherein the piezoelectric transformer element is fixed to the circuit board by the use of at least one of a fixing member and a supporting member made of an elastic material having flexibility and interposed between the piezoelectric transformer element and the circuit board so as to cover vibration node portions of the piezoelectric transformer element and at least a part of a remaining portion except the vibration node portions.

According to this invention, there is also provided a mounting structure of a piezoelectric transformer element which is mounted on a circuit board equipped with at least one circuit component for driving the piezoelectric transformer element, wherein the circuit board is formed in a manner such that an area between portions corresponding to vibration node portions of the piezoelectric transformer element and outer areas outside of the above-mentioned portions are depressed comparing with the portions corresponding to the vibration node portions and that the length across the outer areas exceeds the length of the piezoelectric transformer element, the piezoelectric transformer element being fixed to the circuit board by the use of a fixing member made of an elastic material having flexibility and interposed between the piezoelectric transformer element and the circuit board at the vibration node portions of the piezoelectric transformer element.

According to this invention, there is also provided a mounting method of a piezoelectric transformer element which is mounted on a circuit board equipped with at least one circuit component for driving the piezoelectric transformer element, wherein the piezoelectric transformer element is fixed to the circuit board by the use of at least one of a fixing member and a supporting member made of an elastic material having flexibility and interposed between the piezoelectric transformer element and the circuit board so as to cover vibration node portions of the piezoelectric transformer element and at least a part of a remaining portion except the vibration node portions.

According to this invention, there is also provided a mounting method of a piezoelectric transformer element which is mounted on a circuit board equipped with at least one circuit component for driving the piezoelectric transformer element, wherein the circuit board is formed in a manner such that an area between portions corresponding to vibration node portions of the piezoelectric transformer element and outer areas outside of the above-mentioned portions are depressed comparing with the portions corresponding to the vibration node portions and that the length across the outer areas exceeds the length of the piezoelectric transformer element, the piezoelectric transformer element being fixed to the circuit board by the use of a fixing member made of an elastic material having flexibility and interposed between the piezoelectric transformer element and the circuit board at the vibration node portions of the piezoelectric transformer element.

Thus, in this invention, as a method of mounting a piezoelectric transformer element on a circuit board equipped with at least one circuit component for driving the piezoelectric transformer element, the piezoelectric transformer element is fixed at vibration nodes by the use of a flexible elastic material (preferably, silicone or the like). Furthermore, another flexible elastic material is inserted in a portion other than the vibration nodes in a spot-like fashion or in parallel to the vibration nodes to be used as a spacer. In this manner, the piezoelectric transformer has a structure hard to transmit the vibration to the circuit board upon excitation which is not a single mode excitation. Thus, it is possible to suppress a heat generation and an audible sound.

BEST MODE FOR EMBODYING THE INVENTION

Figure 1:
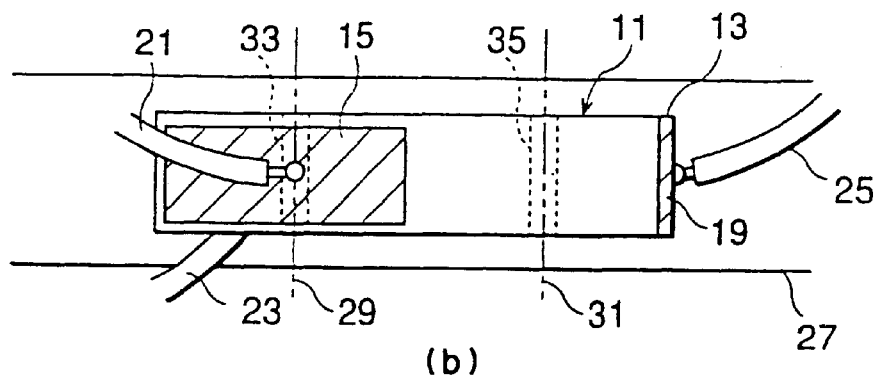
FIG. 1(a) is a plan view showing a conventional mounting structure of a piezoelectric transformer element.
FIG. 1(b) is a side view showing the mounting structure of the piezoelectric transformer element illustrated in FIG. 1(a)
Figure 1:
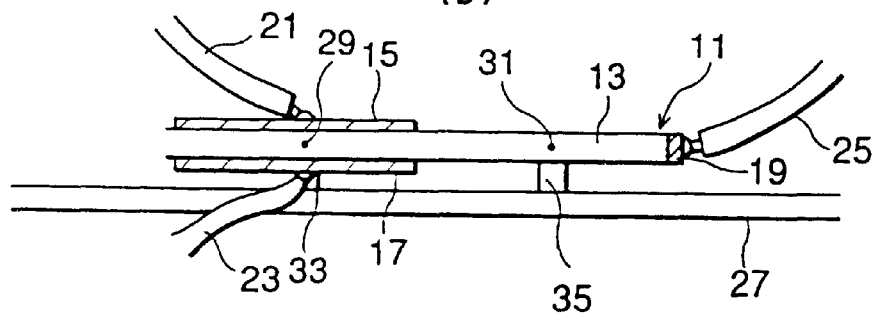

Before describing the best mode for embodying this invention, description will at first be made about a conventional mounting structure of a piezoelectric transformer element with reference to FIG. 1 in order to facilitate an understanding of this invention.

Referring to FIG. 1(a) and FIG. 1(b), a piezoelectric transformer element 11 comprises a rectangular piezoelectric ceramic plate or a multilayer structure (hereinafter referred to as a rectangular piezoelectric plate 13) including internal electrode layers and piezoelectric-ceramic layers, outer electrodes 15 and 17 formed on both of the upper and the lower surfaces of the rectangular piezoelectric plate 13 to extend over an approximate half at the side of one end as depicted by hatching, and an outer electrode 19 formed on an end surface of the rectangular piezoelectric plate 13 in the remaining approximate half not provided with the outer electrodes 15 and 17 as similarly depicted by hatching. The outer electrodes 15, 17, and 19 are connected to lead wires 21, 23, and 25 by soldering or the like, respectively. In order to mount the piezoelectric transformer element 11 on a circuit board 27, they are bonded through fixing members 33 and 35 made of a flexible elastic material (a silicone-based adhesive or the like) and arranged on the lower surface of the piezoelectric transformer element 11 beneath vibration nodes 29 and 31 thereof. One of the lead wires 21 and 23 connected to the outer electrodes 15 and 17 is used as an input terminal while the lead wire 25 connected to the outer electrode 19 is used as an output terminal. The other of the lead wires 21 and 23 connected to the outer electrodes 15 and 17 is used as a common terminal. When the input side is applied with an AC voltage having a frequency equal to a resonance frequency, the piezoelectric transformer element 11 resonates. By this resonance, an AC voltage raised by a step-up ratio of the piezoelectric transformer element is produced between the input terminal and the common terminal.

Now, description will be made about embodiments of this invention with reference to FIG. 2 through FIG. 8.

Referring to FIG. 2(a) and FIG. 2(b), a piezoelectric transformer element 11 according to a first embodiment of this invention has a structure similar to that of the conventional one illustrated in FIG. 1. Specifically, the piezoelectric transformer element 11 comprises a rectangular piezoelectric plate 13, outer electrodes 15 and 17 formed on both of the upper and the lower surfaces of the rectangular piezoelectric plate 13 to extend over an approximate half at the side of one end, and an outer electrode 19 formed on an end surface of the rectangular piezoelectric plate 13 in the remaining approximate half not provided with the outer electrodes 15 and 17. Like in FIG. 1, lead wires 21, 23, and 25 are provided although not illustrated in FIG. 2(a) and FIG. 2(b).

In the first embodiment of this invention, the piezoelectric transformer element 11 is mounted on a circuit board 27 via fixing members 33 and 35 made of a flexible elastic material (a silicone-based adhesive or the like) and introduced at and adhered to the lower surface of the piezoelectric transformer element 11 beneath vibration nodes 29 and 31 thereof.

Furthermore, in the first embodiment of this invention, disk-shaped spacer members 37 and 39 made of completely dry silicone such as silicone rubber as a flexible elastic material are introduced under an edge portion at one end of the piezoelectric transformer element 11 and adhered by the silicone-based adhesive. In addition, a disk-shaped spacer member 41 made of silicone as a flexible elastic material is also introduced under, and adhered by the silicone-based adhesive to, an edge portion at the other end.

Thus, the piezoelectric transformer element is supported by the three spacer members 37, 39, and 41.

Figure 2:
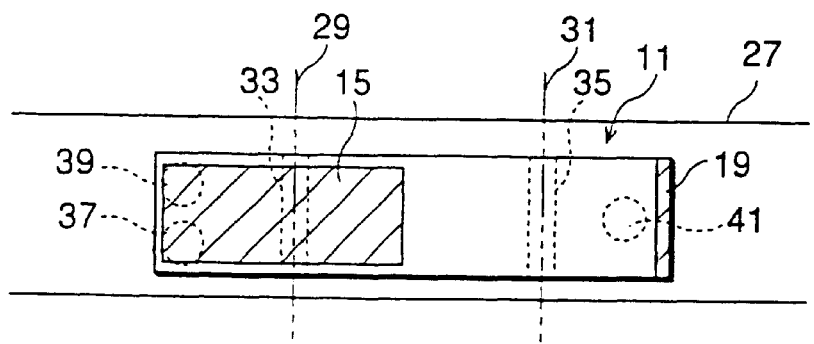
FIG. 2(a) is a plan view showing a mounting structure of a piezoelectric transformer element according to a first embodiment of this invention.
FIG. 2(b) is a side view showing the mounting structure of the piezoelectric transformer element illustrated in FIG. 2(a)
Figure 2:
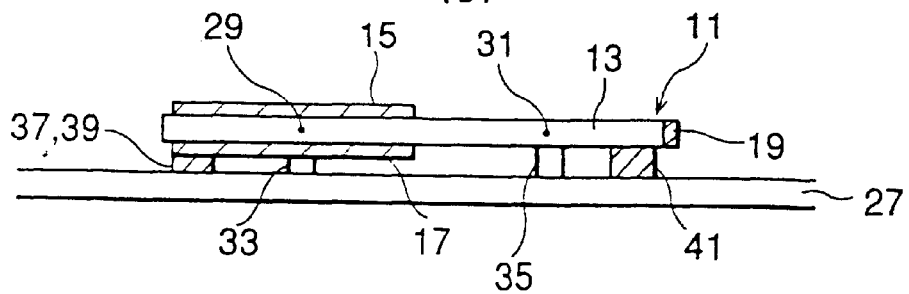

Referring to FIG. 3(a) and FIG. 3(b), a mounting structure of a piezoelectric transformer element according to a second embodiment of this invention is different from the structure illustrated in FIG. 2 in that spacer members 41 and 43 also made of silicone as a flexible elastic material are introduced under, and adhered by silicone-based adhesive to, an edge portion at the other end of the piezoelectric transformer element 11, thus the piezoelectric transformer element being supported by four points in total including those at the one end. Except the above-mentioned difference, the structure is similar to that of the first embodiment illustrated in FIG. 2.

Figure 3:
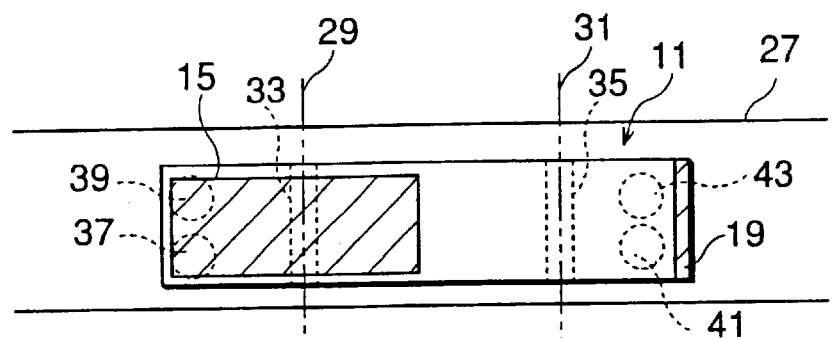
FIG. 3(a) is a plan view showing a mounting structure of a piezoelectric transformer element according to a second embodiment of this invention.
FIG. 3(b) is a side view showing the mounting structure of the piezoelectric transformer element illustrated in (a)
Figure 3:
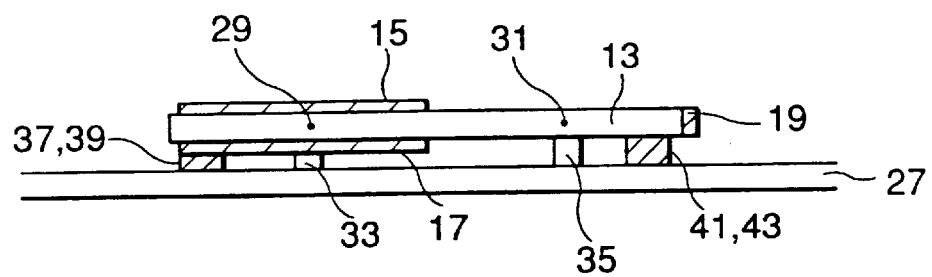
Figure 4:
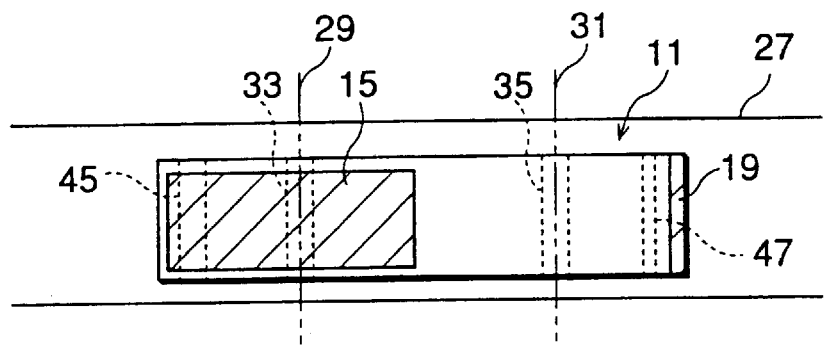
FIG. 4(a) is a plan view showing a mounting structure of a piezoelectric transformer element according to a third embodiment of this invention.
FIG. 4(b) is a side view showing the mounting structure of the piezoelectric transformer element illustrated in FIG. 4(a)
Figure 4:
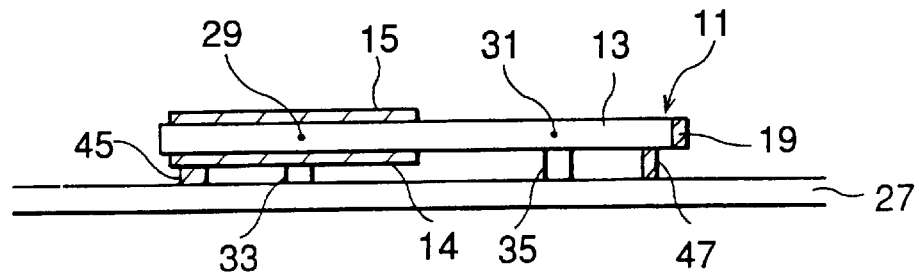
Figure 5:
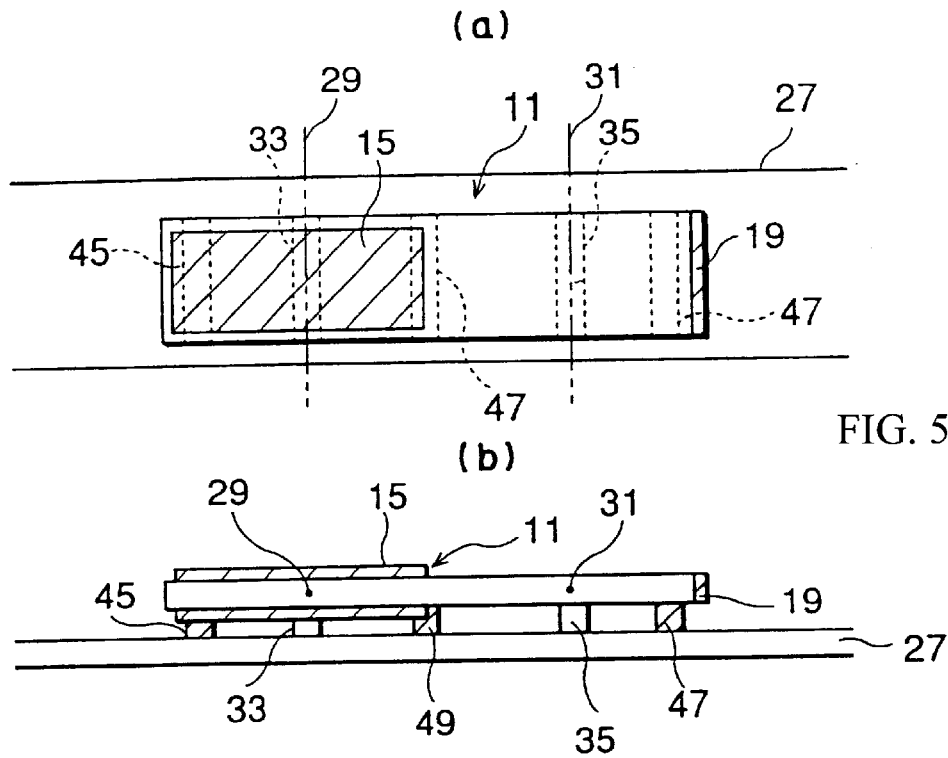
FIG. 5(a) is a plan view showing a mounting structure of a piezoelectric transformer element according to a fourth embodiment of this invention.
FIG. 5(b) is a side view showing the mounting structure of the piezoelectric transformer element illustrated in FIG. 5(a)

Referring to FIG. 4(a) and FIG. 4(b), in a mounting structure of a piezoelectric transformer element 11 according to a third embodiment of this invention, the piezoelectric transformer element 11 is similar in structure to each of the conventional one illustrated in FIG. 1 and the first and the second embodiments illustrated in FIG. 2 and FIG. 3.

As shown in FIG. 4(a) and FIG. 4(b), strip-like fixing members 33 and 35 made of an elastic material having flexibility are arranged on the lower surface of the piezoelectric transformer element 11 beneath vibration nodes 29 and 31 thereof. Spacer members 45 and 47 each of which serves as a single strip-like supporting member are inserted and adhered at the input side and the output side in parallel to the fixing members 33 and 52 at the vibration nodes.

Referring to FIG. 5(a) and FIG. 5(b), in a mounting structure of a piezoelectric transformer element 11 according to a fourth embodiment of this invention, the piezoelectric transformer element 11 is similar in a structure to each of the conventional one illustrated in FIG. 1 and the first through the third embodiments illustrated in FIG. 1 through FIG. 4.

As shown in FIG. 5(a) and FIG. 5(b), strip-like fixing members 33 and 35 made of an elastic material having flexibility are arranged on the lower surface beneath vibration nodes 29 and 31. Spacer members 45 and 47 each of which is a single strip-like member are introduced under, and adhered to, the input side and the output side and extend in parallel to the fixing members 33 and 35 at the vibration nodes. The fourth embodiment is different from the embodiment illustrated in FIG. 4 in that a strip-like spacer 49 similar to the spacer members 45 and 47 is introduced under, and adhered at, the center of the piezoelectric transformer element 11 in parallel to the fixing members 33 and 35 at the vibration nodes.

As specific examples according to the first through the fourth embodiments described above, piezoelectric transformer elements having a three-dimensional size of 53/83/3.3 mm were mounted on boards. Thereafter, comparison of characteristics was carried out between the first embodiment of this invention and the third embodiment of this invention as shown in the following Table 1.

TABLE 1

| Item | Conventional Product | Products of Present Invention | |
| --- | --- | --- | --- |
| | | First Embodiment | Second Embodiment |
| Step-up Ratio | 90 | 91 | 90 |
| Driving Frequency(kHz) | 64.5 | 64.5 | 64.5 |
| Heat Generation (° C.) | 18 | 17 | 18 |
| Audible Sound (dB) | 70 | 61 | 62 |

As shown in the above Table 1, no substantial change and no substantial deterioration were observed in heat generation, step-up ratio, and driving frequency of the piezoelectric transformer, as compared with the conventional mounting method. In addition, the level of the audible sound was reduced by 8 dB or more, as compared with the conventional product. Thus, the characteristics of a practically acceptable level were obtained.

Referring to FIG. 6(a) and FIG. 6(b), in a mounting structure of a piezoelectric transformer element according to a fifth embodiment of this invention, the piezoelectric transformer element 11 has a structure similar to that of the conventional one illustrated in FIG. 1. Specifically, the piezoelectric transformer element 11 comprises a rectangular piezoelectric plate 13, outer electrodes 15 and 17 formed on both of the upper and the lower surfaces of the rectangular piezoelectric plate 13 to extend over an approximate half at the side of one end, and an outer electrode 19 formed on an end surface of the rectangular piezoelectric plate 13 in the remaining approximate half having none of the outer electrodes 15 and 17. In addition, the outer electrodes 15, 17, and 19 are connected by soldering to lead wires 21, 23, and 25, respectively.

In the fifth embodiment of this invention, the piezoelectric transformer element 11 is mounted on a circuit board 27 by a fixing member 51 made of a flexible elastic material (silicone or the like) introduced under, and adhered to, the entire surface of the piezoelectric transformer element 11 including the positions beneath vibration nodes 27 and 29.

The above-mentioned fifth embodiment of this invention can provide the effect similar to that of the mounting structure in each of the first through the fourth embodiments.

Referring to FIG. 7(a) and FIG. 7(b), in a mounting structure of a piezoelectric transformer element according to a sixth embodiment of this invention, the piezoelectric transformer element 11 is similar in structure to those illustrated in FIG. 1 through FIG. 6. Specifically, the piezoelectric transformer element 11 comprises a rectangular piezoelectric plate 13, outer electrodes 15 and 17 formed on both of the upper and the lower surfaces of the rectangular piezoelectric plate 13 to extend over an approximate half at the side of one end, and an outer electrode 19 formed on an end surface of the rectangular piezoelectric plate 13 in the remaining approximate half having none of the outer electrodes 15 and 17. In addition, the outer electrodes 15, 17, and 19 are connected by soldering to the lead wires 21, 23, and 25, respectively.

Figure 6:
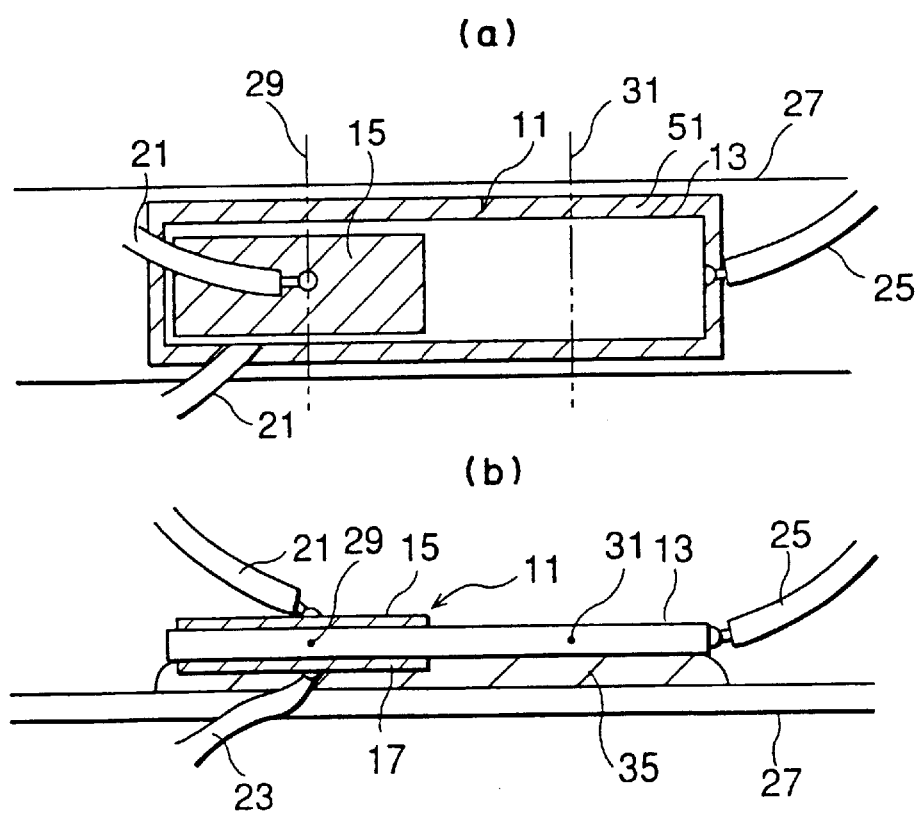
FIG. 6(a) is a plan view showing a mounting structure of a piezoelectric transformer element according to a fifth embodiment of this invention.
FIG. 6(b) is a side view showing the mounting structure of the piezoelectric transformer element illustrated in (a)
Figure 7:
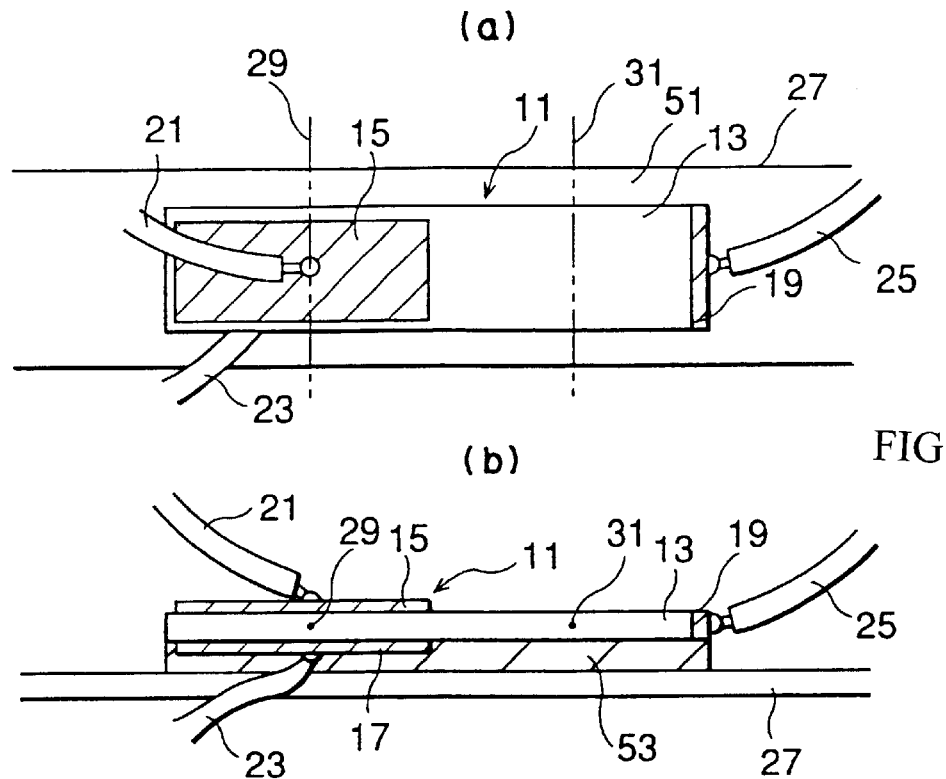
FIG. 7(a) is a plan view showing a mounting structure of a piezoelectric transformer element according to a sixth embodiment of this invention.
FIG. 7(b) is a side view showing the mounting structure of the piezoelectric transformer element illustrated in (a)
Figure 8:
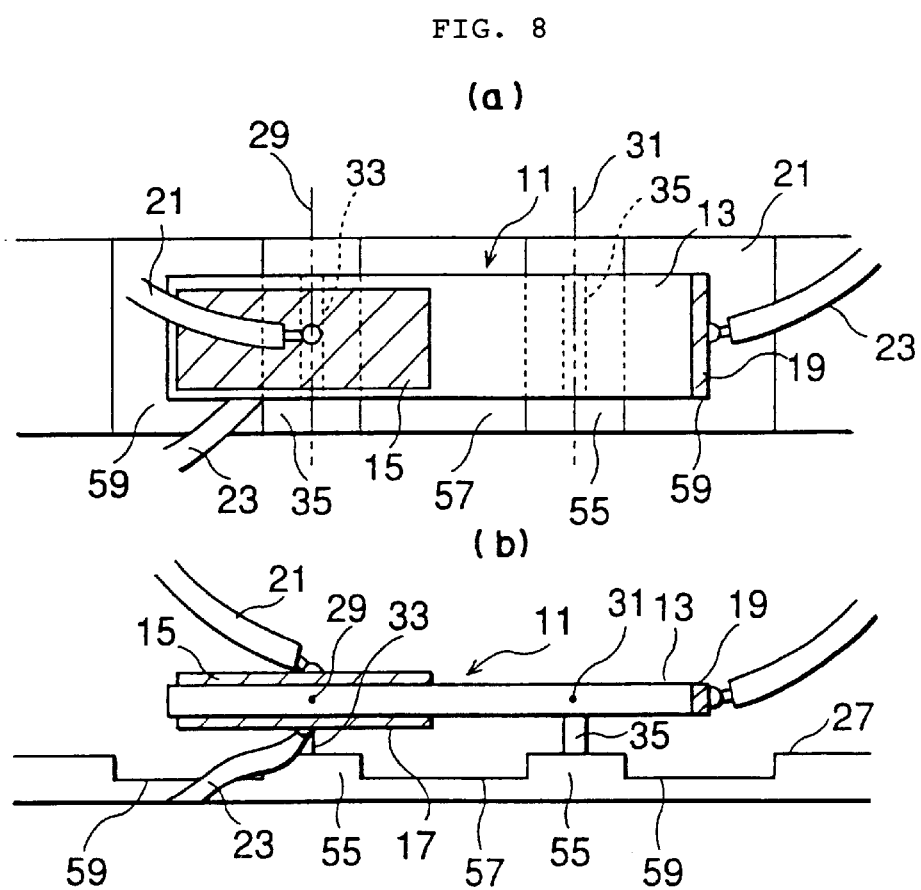
FIG. 8(a) is a plan view showing a mounting structure of a piezoelectric transformer element according to a seventh embodiment of this invention.
FIG. 8(b) is a side view showing the mounting structure of the piezoelectric transformer element illustrated in (a)

The sixth embodiment of this invention is different in structure from that illustrated in FIG. 6 in that the piezoelectric transformer element 11 is mounted on a circuit board 27 via a spacer member 53 made of silicone as a flexible elastic material and serving as a supporting member, which is introduced under the entire surface of the piezoelectric transformer element 11 including the positions beneath the vibration nodes 18 and 19 thereof, and adhered thereto by a silicone-based adhesive.

The sixth embodiment of this invention can also provide the effect similar to those in the first through the fifth embodiments.

Referring to FIG. 8(a) and FIG. 8(b), in a mounting structure of a piezoelectric transformer element according to a seventh embodiment of this invention, the piezoelectric transformer element 11 has a structure similar to that of the conventional one illustrated in FIG. 1. Specifically, the piezoelectric transformer element 11 comprises a rectangular piezoelectric ceramic plate or a multilayer structure (hereinafter referred to as a rectangular piezoelectric plate 13) including internal electrode layers and piezoelectric ceramic layers, outer electrodes 15 and 17 formed on both of the upper and the lower surfaces of the rectangular piezoelectric plate 13 to extend over an approximate half at the side of one end, and an outer electrode 19 formed on an end surface of the remaining approximate half having none of the outer electrodes 15 and 17. The outer electrodes 15, 17, and 19 are connected by soldering to lead wires 21, 23, and 25, respectively.

In addition, a circuit board 27 is provided with a groove 57 formed between base portions 55 and 55 corresponding to vibration nodes 29 and 31 of the piezoelectric transformer element 11, and grooves 59 and 59 formed outside of the base portions 55 to extend over the width beyond the ends of the piezoelectric transformer element 11.

In the seventh embodiment of this invention, the piezoelectric transformer element 11 is mounted on the circuit board 27 in a manner such that the lower surface of the piezoelectric transformer element 11 is adhered to the base portions of the circuit board 27 at the positions beneath the vibration nodes 29 and 31 via fixing members 33 and 35 made of a flexible elastic material (silicone or the like).

The above-mentioned seventh embodiment of this invention can also provide the effect similar to those in the first through the fourth embodiments. In addition, it is possible to prevent the contact between the ends of the piezoelectric transformer element 11 and the circuit board 27 due to warping of the circuit board 27 resulting from the deviation in resonance frequency of the piezoelectric transformer element 11. Therefore, generation of the audible sound can be reduced.

Figure 9:
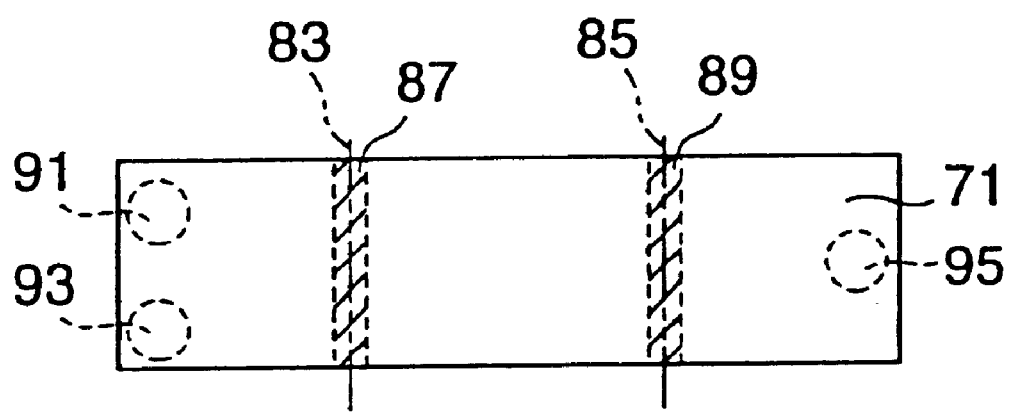
FIG. 9(a) is a plan view showing a mounting structure of a piezoelectric transformer element according to an eighth embodiment of this invention.
FIG. 9(b) is a side view showing the mounting structure of the piezoelectric transformer element illustrated in (a).
Figure 9:
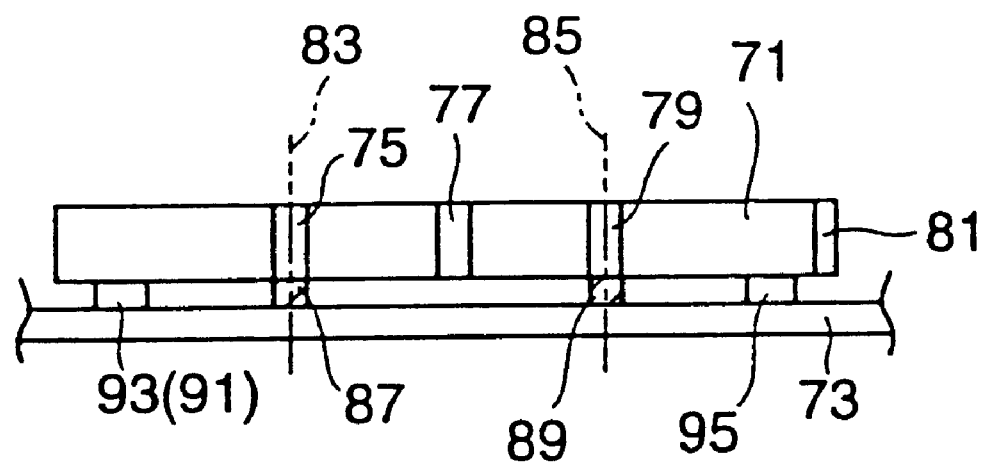

Referring to FIG. 9(*a*) and FIG. 9(*b*), in a mounting structure of a piezoelectric transformer element according to an eighth embodiment of this invention, it is mounted on a circuit board 73 equipped with components for driving the piezoelectric transformer element 71 in a power supply circuit.

The above-mentioned piezoelectric transformer element is driven in vibration modes of $(1/2)\lambda$ or $\lambda$ and comprises outer electrodes 75, 77, 79, and 81 formed on both of the front and the back side surfaces of the transformer. The piezoelectric transformer 71 is mounted on the circuit board 73 via fixing members 87 and 89 made of a flexible elastic material and interposed therebetween at the positions beneath vibration nodes 83 and 85 of the piezoelectric transformer as well as supporting members 91, 93, and 95 similar to the spacer members in the first embodiment to prevent generation of the sound. Thus, the mounting structure of the eighth embodiment shows that the mounting structures of the first through the seventh embodiments can be applied to a piezoelectric transformer element having a different structure.

In the eighth embodiment of this invention, the fixing members 87 and 89 are disposed at the portions of the vibration nodes (nodal points) 83 and 85. However, if the fixing members 87 and 89 are disposed at positions nearer to the both ends than the nodal points 83 and 85 and at positions spaced by 5/1 of the whole length from the both ends or nearer thereto, the supporting members 91, 93, and 95 can be omitted. Furthermore, the fixing members 87 and 89 can be replaced by supporting members, further may be unnecessary to fix by adhesion or support the nodal points 83 and 85.

As described above, according to this invention, in the structure in which the piezoelectric transformer element for use in the piezoelectric inverter is mounted on the circuit board equipped with the circuit components for driving the piezoelectric transformer element, use is made of the mounting method in which the flexible elastic material is introduced under, and adhered as the spacer to, the position except the vibration nodes. In this manner, it is possible to reduce generation of the audible sound without changing the characteristics such as the heat generation, the step-up ratio, and the driving frequency.

In addition, according to this invention, it is possible to provide the mounting method for obtaining the mounting structure similar to that described above.

INDUSTEIAL APPLICABILITY

As described above, the mounting structure and the mounting method of a piezoelectric transformer according to this invention is adapted to the use of the piezoelectric transformer element as a piezoelectric inverter of a backlight of a liquid crystal display or the like by mounting it on a circuit board equipped with a circuit component.

What is claimed is:

1. A mounting structure of a piezoelectric transformer element which is mounted on a circuit board equipped with at least one circuit component for driving said piezoelectric transformer element, wherein said circuit board is formed in a manner such that an area between portions corresponding to vibration node portions of said piezoelectric transformer element and outer areas outside of the above-mentioned portions are depressed comparing with the portions corresponding to said vibration node portions and that the length across said outer areas exceeds the length of said piezoelectric transformer element, said piezoelectric transformer element being fixed to said circuit board by the use of a fixing member made of an elastic material having flexibility and interposed between said piezoelectric transformer element and said circuit board at said vibration node portions of said piezoelectric transformer element.

* * * * *